United States Patent
Miyazaki et al.

(10) Patent No.: US 11,024,487 B2
(45) Date of Patent: Jun. 1, 2021

(54) CURRENT SWITCH DEVICE INCLUDING FIRST AND SECOND ELECTRODES AND FIRST AND SECOND GRIDS

(71) Applicant: KABUSHIKI KAISHA TOSHIBA, Minato-ku (JP)

(72) Inventors: Hisao Miyazaki, Yokohama (JP); Shigeya Kimura, Yokohama (JP); Hisashi Yoshida, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/903,565

(22) Filed: Jun. 17, 2020

(65) Prior Publication Data

US 2020/0411284 A1    Dec. 31, 2020

(30) Foreign Application Priority Data

Jun. 28, 2019 (JP) .............................. JP2019-121915
Mar. 12, 2020 (JP) .............................. JP2020-043040

(51) Int. Cl.
*H01J 37/32* (2006.01)
(52) U.S. Cl.
CPC .... *H01J 37/3255* (2013.01); *H01J 37/32018* (2013.01); *H01J 37/32055* (2013.01)
(58) Field of Classification Search
CPC ............. H01J 37/3255; H01J 37/32055; H01J 37/32018
See application file for complete search history.

(56) References Cited

U.S. PATENT DOCUMENTS

| 4,394,622 A | 7/1983 | Rink |
| 5,336,975 A | 8/1994 | Goebel et al. |
| 2007/0029935 A1 | 2/2007 | Sakai et al. |
| 2007/0103083 A1 | 5/2007 | Ono et al. |
| 2008/0203885 A1 | 8/2008 | Ono et al. |
| 2009/0050899 A1 | 2/2009 | Ikeda et al. |
| 2016/0020057 A1 | 1/2016 | Sommerer et al. |

FOREIGN PATENT DOCUMENTS

| JP | 58-1950 A | 1/1983 |
| JP | 2595188 B2 | 3/1997 |
| JP | 10-40805 A | 2/1998 |
| JP | 2002-197999 A | 7/2002 |
| JP | 2007-128783 A | 5/2007 |
| JP | 2008-210756 A | 9/2008 |
| JP | 2009-152096 A | 7/2009 |
| JP | 4287416 B2 | 7/2009 |
| JP | 5051835 B2 | 10/2012 |
| JP | 6366983 B2 | 8/2018 |

*Primary Examiner* — Joseph L Williams
(74) *Attorney, Agent, or Firm* — Oblon, McClelland, Maier & Neustadt, L.L.P.

(57) ABSTRACT

A switch device of an embodiment includes a first electrode including a first layer including at least one selected from the group consisting of B, C, Al, Si, and Ga, a second electrode separated from the first electrode, a first grid disposed between the first electrode and the second electrode, and a second grid disposed between the first grid and the second electrode.

20 Claims, 5 Drawing Sheets

CURRENT SWITCH DEVICE INCLUDING FIRST AND SECOND ELECTRODES AND FIRST AND SECOND GRIDS

CROSS-REFERENCE TO RELATED APPLICATION

This application is based upon and claims the benefit of priority from Japanese Patent Applications No. 2019-121915, filed on Jun. 28, 2019 and No. 2020-043040, filed on Mar. 12, 2020, the entire contents of which are incorporated herein by reference.

FIELD

Embodiments described herein relate generally to a switch device.

BACKGROUND

A switch device is desired, for example, to switch large currents.

DETAILED DESCRIPTION

Figure 1A:
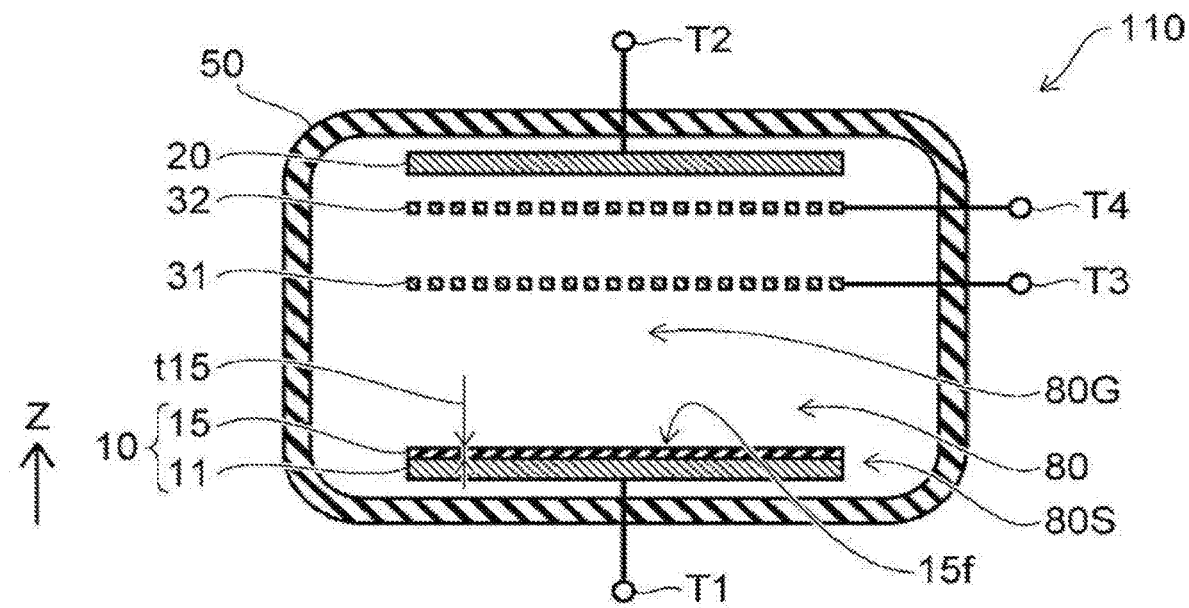
FIG. 1A is a schematic cross-sectional view of a switch device according to an embodiment.

A switch device of an embodiment includes a first electrode including a first layer including at least one selected from the group consisting of B, C, Al, Si, and Ga, a second electrode separated from the first electrode, a first grid disposed between the first electrode and the second electrode, and a second grid disposed between the first grid and the second electrode.

Hereinafter, embodiments of this disclosure will be described with reference to the drawings.

The drawings are schematic or conceptual views. For example, a relation between a thickness and a width of each part and a size ratio between parts are not necessarily equal to actual ones. Dimensions and ratios of an identical part may be shown differently among the drawings.

In the specification and drawings of the present application, like elements among the drawings are denoted with like reference numerals, and detailed descriptions on the like elements are omitted as appropriate.

First Embodiment

Figure 1B:
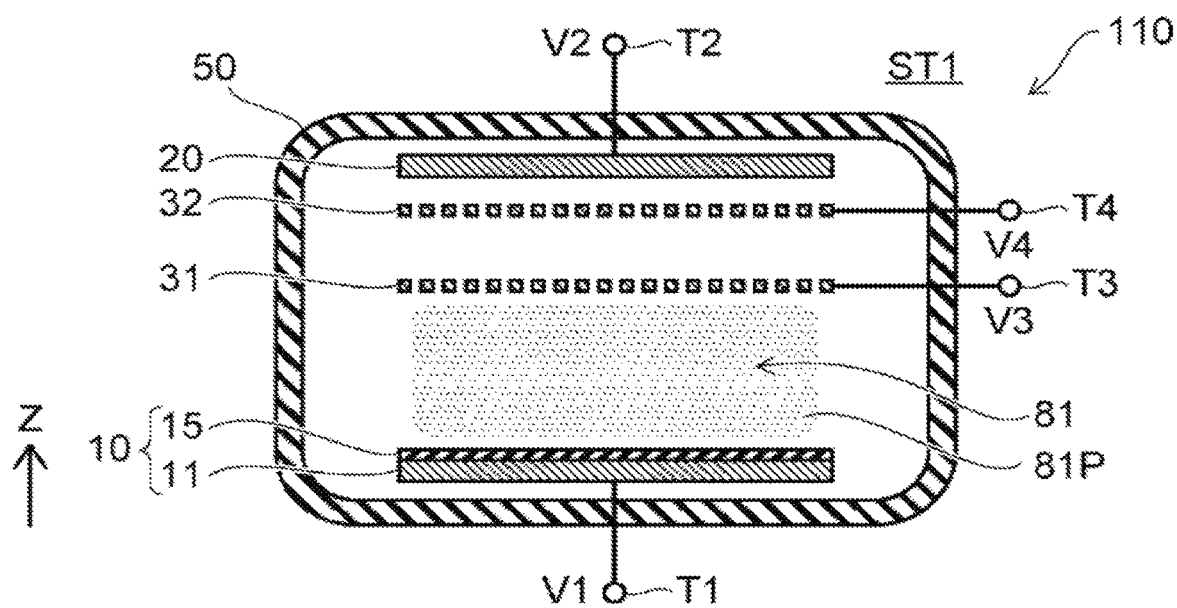
FIG. 1B is a schematic cross-sectional view of the switch device according to an embodiment.
Figure 1C:
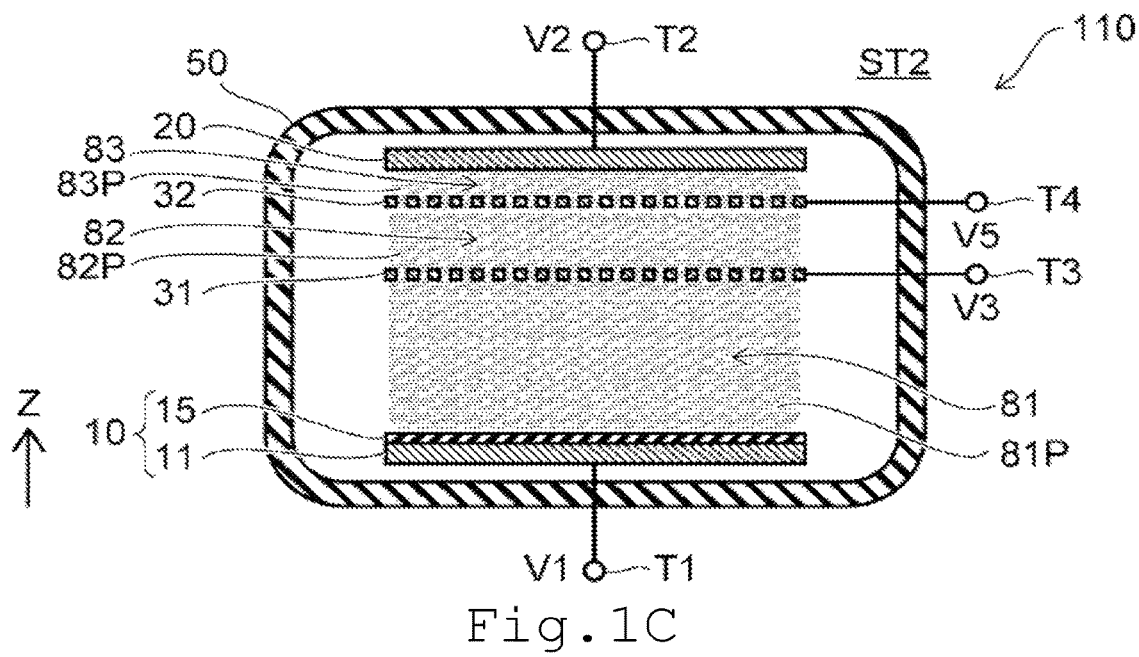
FIG. 1C is a schematic cross-sectional view of the switch device according to an embodiment.

FIGS. 1A, 1B, and 1C are schematic cross-sectional views of a switch device according to an embodiment.

As shown in FIG. 1A, a switch device 110 according to this embodiment includes a container 50, a first electrode 10, a second electrode 20, a first grid 31, and a second grid 32.

The first electrode 10 is disposed inside the container 50. The first electrode 10 includes a first layer 15. The first electrode 10 may include a base 11. For example, the first layer 15 is disposed on the base 11. The first layer 15 includes at least one selected from the group consisting of B, C, Al, Si, and Ga. In one example, the first layer 15 includes diamond. For example, the first layer 15 includes carbon. The first layer 15 may include carbon and B. For example, the first layer 15 may include AlN. As described later, the first layer 15 may include a plurality of crystal grains. At least a part of the first layer 15 may be amorphous. The first layer 15 may include, for example, a first element including at least one selected from the group consisting of B, C, Al, Si, and Ga and a second element including at least one selected from the group consisting of N, O, and P. The first layer 15 may include a wide band gap semiconductor.

In one example, the first layer 15 includes at least one selected from the group consisting of diamond, graphite, nitride semiconductor ($Al_xGa_yN_{1-x-y}$, $0 \leq x \leq 1$, $0 \leq y \leq 1$), and alumina cement (CaO—$Al_2O_3$). In one example, the first layer 15 has a structure with a laminated layer including at least one selected from the group consisting of diamond, graphite, nitride semiconductor ($Al_xGa_yN_{1-x-y}$, $0 \leq x \leq 1$, $0 \leq y \leq 1$), and alumina cement (CaO—$Al_2O_3$). Diamond and nitride semiconductor have p- or n-type conductivity. Alumina cement may include additives such as $FeO_2$, $TiO_2$, and $SiO_2$. An example of diamond includes sintered diamond. Another example of diamond includes polycrystalline diamond.

The first electrode 10 also employs an aspect in which the first electrode 10 includes the first layer 15 but not the base 11.

The second electrode 20 is disposed inside the container 50. The second electrode 20 is separated from the first electrode 10. For example, the first layer 15 is between the base 11 and the second electrode 20. A gap 80 is disposed between the first layer 15 and the second electrode 20.

A direction from the first electrode 10 to the second electrode 20 is defined as "Z-axis direction". The second electrode 20 is separated from the first layer 15 in the Z-axis direction.

The first grid 31 is disposed inside the container 50. The first grid 31 is disposed between the first electrode 10 and the second electrode 20. The first grid 31 is disposed between the first layer 15 and the second electrode 20.

The second grid 32 is disposed inside the container 50. The second grid 32 is disposed between the first grid 31 and the second electrode 20.

In the use of the switch device 110, a gas 80G is introduced into the container 50. The switch device 110 may include the gas 80G. The gas 80G is disposed between the first electrode 10 and the second electrode 20. The gas 80G fills the gap 80. The gas 80G includes, for example, at least one selected from the group including helium, neon, and argon. In one example, the gas 80G includes argon. The gas 80G may include argon and hydrogen.

The container 50 keeps a space 80S inside the container 50 airtight. The space 80S inside the container 50 has a pressure of, for example, less than 1 atmosphere. The space 80S can be in a reduced pressure state.

The container 50 is preferably an airtight container that keeps the space 80S in the container 50 airtight.

As shown in FIG. 1A, the switch device 110 may include a first terminal T1, a second terminal T2, a third terminal T3, and a fourth terminal T4. The first terminal T1, the second terminal T2, the third terminal T3, and the fourth terminal T4 are disposed outside the container 50. The first terminal T1 is electrically connected to the first electrode 10. The second terminal T2 is electrically connected to the second electrode 20. The third terminal T3 is electrically connected to the first grid 31. The fourth terminal T4 is electrically connected to the second grid 32.

Based on potentials of these terminals, the switch device 110 is set to a plurality of states (for example, first state and second state).

FIG. 1B illustrates the first state ST1. In the first state ST1, the first terminal T1 is set to a first potential V1, the second terminal T2 is set to a second potential V2, the third terminal T3 is set to a third potential V3, and the fourth terminal T4 is set to a fourth potential V4. The second potential V2 is higher than the first potential V1. The third potential V3 is between the first potential V1 and the second potential V2. The fourth potential V4 is lower than the third potential V3.

The first potential V1 is, for example, a negative potential or a ground potential. The second potential V2 is, for example, a positive potential. The third potential V3 is, for example, an intermediate potential. The fourth potential V4 is, for example, a negative potential.

FIG. 1C illustrates the second state ST2. In the second state ST2, the first terminal T1 is set to the first potential V1, the second terminal T2 is set to the second potential V2, the third terminal T3 is set to the third potential V3, and the fourth terminal T4 is set to a fifth potential V5. The fifth potential V5 is higher than the third potential V3. The fifth potential V5 is, for example, a positive potential.

A current flowing between the first terminal T1 and the second terminal T2 in the second state ST2 is larger than a current flowing between the first terminal T1 and the second terminal T2 in the first state ST1.

The first state ST1 is, for example, non-conductive. The second state ST2 is, for example, conductive. The first state ST1 is, for example, a high resistance state. The second state ST2 is, for example, a low resistance state.

In this manner, switching is performed in the switch device 110. The switch device 110 is, for example, a circuit breaker. The switch device 110 is, for example, a high-current circuit breaker. The first electrode 10 is, for example, a cathode. The second electrode 20 is, for example, an anode.

As shown in FIG. 1B, in the first state ST1, a first plasma 81P is generated in a first space 81 between the first electrode 10 and the first grid 31. In the first state ST1, a space between the first grid 31 and the second electrode 20 is in an insulating state. In the first state ST1, the switch device 110 is non-conductive.

As shown in FIG. 1C, in the second state ST2, a second plasma 82P is generated in a second space 82 between the first grid 31 and the second grid 32, and a third plasma 83P is generated in a third space 83 between the second grid 32 and the second electrode 20. Accordingly, the third space 83 becomes conductive. In the second state ST2, the first terminal T1 and the second terminal T2 become conductive.

In this embodiment, the first layer 15 includes a first material including at least one selected from the group consisting of B, C, Al, Si, and Ga. In one example, the first layer 15 includes, for example, diamond. Diamond has, for example, a low electron affinity. Accordingly, electrons are efficiently emitted from the first layer 15. Thus, a large current is obtained.

The first material includes, for example, at least one selected from the group consisting of diamond, graphite, nitride semiconductor ($Al_xGa_yN_{1-x-y}$, $0 \leq x \leq 1$, $0 \leq y \leq 1$), sintered diamond, and alumina cement ($CaO\text{---}Al_2O_3$). The first material has, for example, a structure with a single layer including at least one selected from the group consisting of diamond, graphite, nitride semiconductor ($Al_xGa_yN_{1-x-y}$, $0 \leq x \leq 1$, $0 \leq y \leq 1$), sintered diamond, and alumina cement ($CaO\text{---}Al_2O_3$) or includes a laminate with two or more layers including at least one selected from the group consisting of diamond, graphite, nitride semiconductor ($Al_xGa_yN_{1-x-y}$, $0 \leq x \leq 1$, $0 \leq y \leq 1$), sintered diamond, and alumina cement ($CaO\text{---}Al_2O_3$).

Since a nitride semiconductor and an oxide semiconductor also have a low electron affinity, these materials are also preferable from a viewpoint of switching large currents. Since sintered diamond mainly includes diamond, it has a low electron affinity. Graphite is also preferable due to its high thermal conductivity and thermal stability caused by strong chemical bonds. In addition, electride of alumina cement is preferable due to its low electron affinity.

To efficiently emit electrons from the first electrode 10 to the second electrode 20, the first material that emits electrons is disposed on a surface of the first layer 15 that faces the second electrode 20. To efficiently emit electrons from the first electrode 10 to the second electrode 20, the first material that emits electrons is disposed on the entire surface of the first layer 15 facing the second electrode 20.

In a first reference example, the first electrode 10 includes a conductive liquid. In a second reference example, the first electrode 10 includes a metal having a low melting point. In these cases, good flatness is obtained on a surface of the first electrode 10 during operation. This is a possible reason for relatively stable operation. However, in these reference examples, currents that can be switched are small.

On the other hand, in this embodiment, the first layer 15 of the first electrode 10 includes the first material. The first layer 15 has a low electron affinity. Accordingly, electrons from the first layer 15 are emitted efficiently. This enables stable switching of large currents. According to this embodiment, it is possible to provide a switch device that enables switching of large currents.

For example, in the switch device 110, a current flows during operation. This current may cause a cathode (for example, the first electrode 10) to be etched. In this embodiment, the first layer 15 is stable because the first layer 15 includes the aforementioned material. For example, it is possible to suppress etching of the first layer 15 during operation. For example, it is possible to achieve life-span extension.

The first layer 15 including the first material has high etching resistance, making it difficult to etch the first layer 15 during switching operation. Therefore, the switch device 110 of this embodiment operates stably for a long period of time.

The first material included in the first layer 15 has high thermal conductivity. This suppresses a rise in temperature of the first layer 15. For example, an excessive rise in temperature can be suppressed. For example, the occurrence of arc discharges can be suppressed. Accordingly, it is possible to achieve stable operation.

Employing the first layer 15 in the first electrode 10 can suppress a temperature rise of the first layer 15. When the temperature of the first layer 15 rises, it is easy to shift from a glow discharge state which enables switching operation to an arc discharge state which disables current interruption. Controlling the temperature rise of the first layer 15 suppresses an arc discharge and enables a stable glow discharge, which makes it possible to provide the highly reliable switch device 110 that operates stably.

Hereinafter described is an example of experimental results associated with the switch device.

Figure 2:
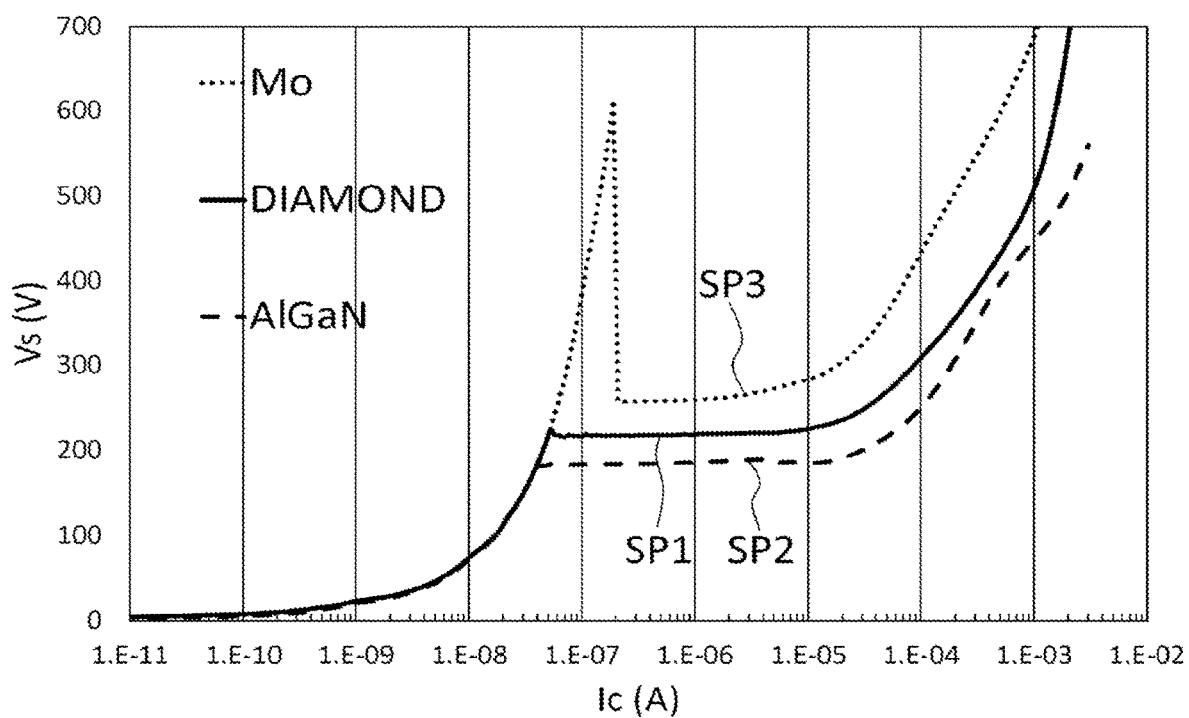
FIG. 2 is a graph illustrating experimental results of the switch device.

FIG. 2 is a graph illustrating experimental results of the switch device.

In FIG. 2, a current Ic (A) flowing between the first terminal T1 and the second terminal T2 in the second state ST2 is taken along the abscissa. A voltage Vs (V) between the first terminal T1 and the second terminal T2 is taken along the ordinate.

In the experiment, a source meter is connected between the first terminal T1 and the second terminal T2. While the current Ic flowing out of a current source is increased with time, the voltage Vs is measured so as to obtain a relation between the current Ic and the voltage Vs.

FIG. 2 illustrates results on a first sample SP1, a second sample SP2, and a third sample SP3. In the first sample SP1, the first layer 15 is diamond. In the second sample SP2, the first layer 15 is AlGaN. In the third sample SP3, the first layer 15 is Mo. In these samples, a distance between the first electrode 10 and the second electrode 20 is 10 mm. The space 80S of the container 50 is filled with the gas 80G including argon and hydrogen. An amount of hydrogen relative to the total amount of argon and hydrogen is 1%. The pressure inside the container 50 is 1 Torr.

In the first to third samples SP1 to SP3, when the voltage Vs increases, the current Ic increases. In each sample, a glow discharge from the first layer 15 can be obtained even in a region where the current is high.

As described above, in the second sample SP2 where the first layer 15 is AlGaN, larger currents are switched than in a case where the first layer 15 employs Mo. In the first sample SP1 where the first layer 15 is diamond, larger currents are switched than in the case where the first layer 15 employs Mo.

As shown in FIG. 2, each sample has a region where the voltage Vs is substantially flat in a region with a relatively low current Ic. When the voltage Vs in this region is small, a loss is low. As shown in FIG. 2, this voltage Vs in the first sample SP1 is smaller than this voltage in the third sample SP3. This indicates that the first sample SP1 has a smaller loss than the third sample SP3. As shown in FIG. 2, this voltage Vs in the second sample SP2 is smaller than this voltage in the first sample SP1. This indicates that the second sample SP2 has a smaller loss than the first sample SP1.

As described above, a higher voltage is obtained in the first sample SP1 and the second sample SP2 than in the third sample SP3. A possible reason for this result is that the first layers 15 in the first sample SP1 and in the second sample SP2 contain the first material.

For example, the first layer 15 (for example, the first material) has an electron affinity of 3 eV or less. Accordingly, electrons from the first layer 15 are emitted easily. The electron affinity of the first layer 15 (for example, the first material) may be negative.

For example, the first layer 15 (for example, the first material) has a band gap of 2 eV or more. This makes it easier to obtain a low electron affinity. The first layer 15 may include, for example, a wide band gap semiconductor.

The first layer 15 preferably has a thickness t15 (see FIG. 1A) of, for example, 0.1 μm or more and 5 mm or less. In the first layer 15, it is easy to obtain high uniformity and stable characteristics. The thickness t15 is a length of the first layer 15 along a direction perpendicular to the Z-axis direction.

When the first layer 15 includes carbon (for example, diamond), the surface of the first layer 15 may be terminated with hydrogen. Accordingly, for example, it is possible to further reduce the electron affinity.

For example, the first layer 15 includes a first surface 15f. The first surface 15f faces the second electrode 20. The first surface 15f faces the first grid 31. The first surface 15f may include hydrogen. Accordingly, for example, it is possible to further reduce the electron affinity.

In order to stabilize a glow discharge, it is preferable that a crystal plane (a plane facing the second electrode 20) of a surface of the first layer 15 (the first surface 15f) should have a uniform crystal plane. A random crystal plane would vary the stability of a glow discharge.

Figure 3A:
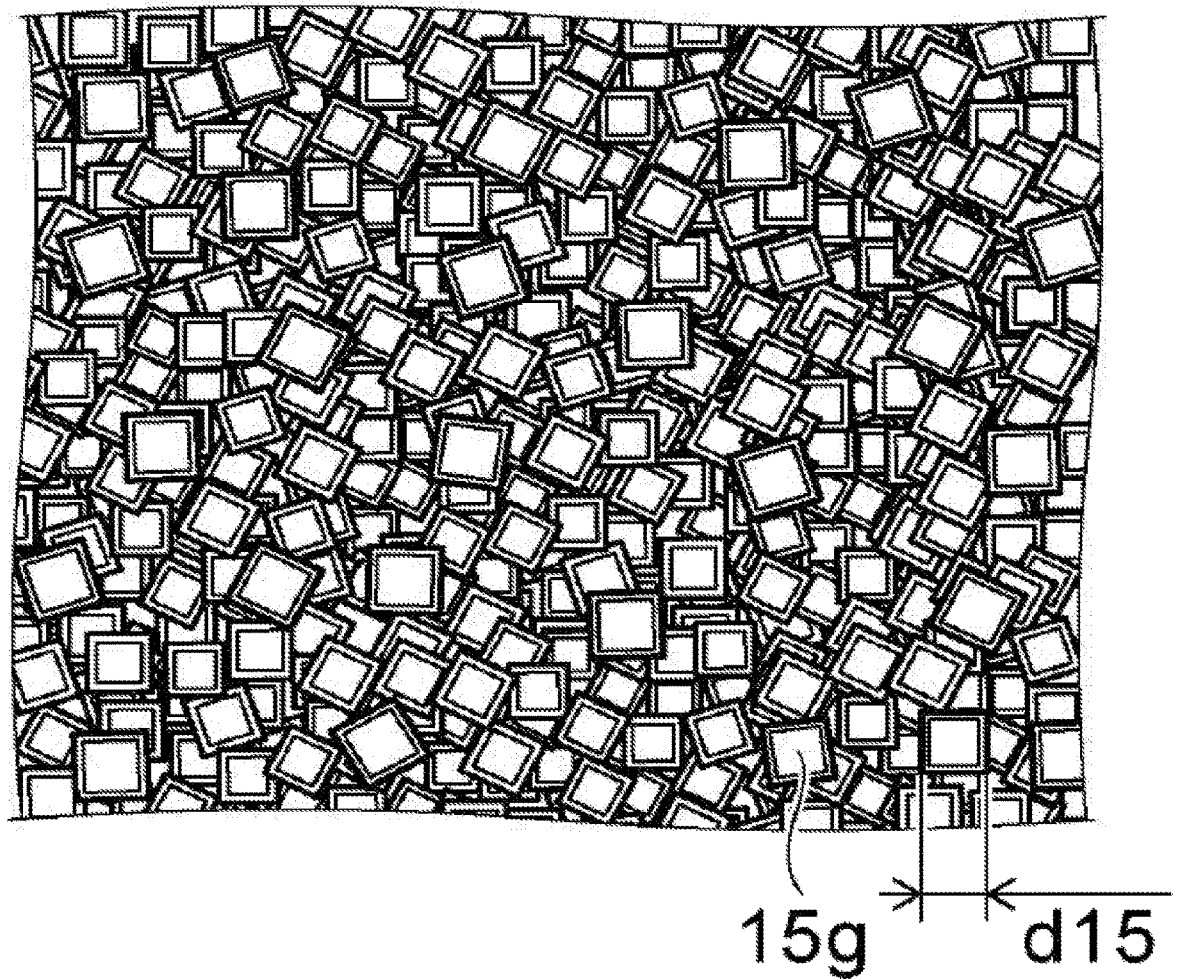
FIG. 3A is a schematic view of the switch device.
Figure 3B:
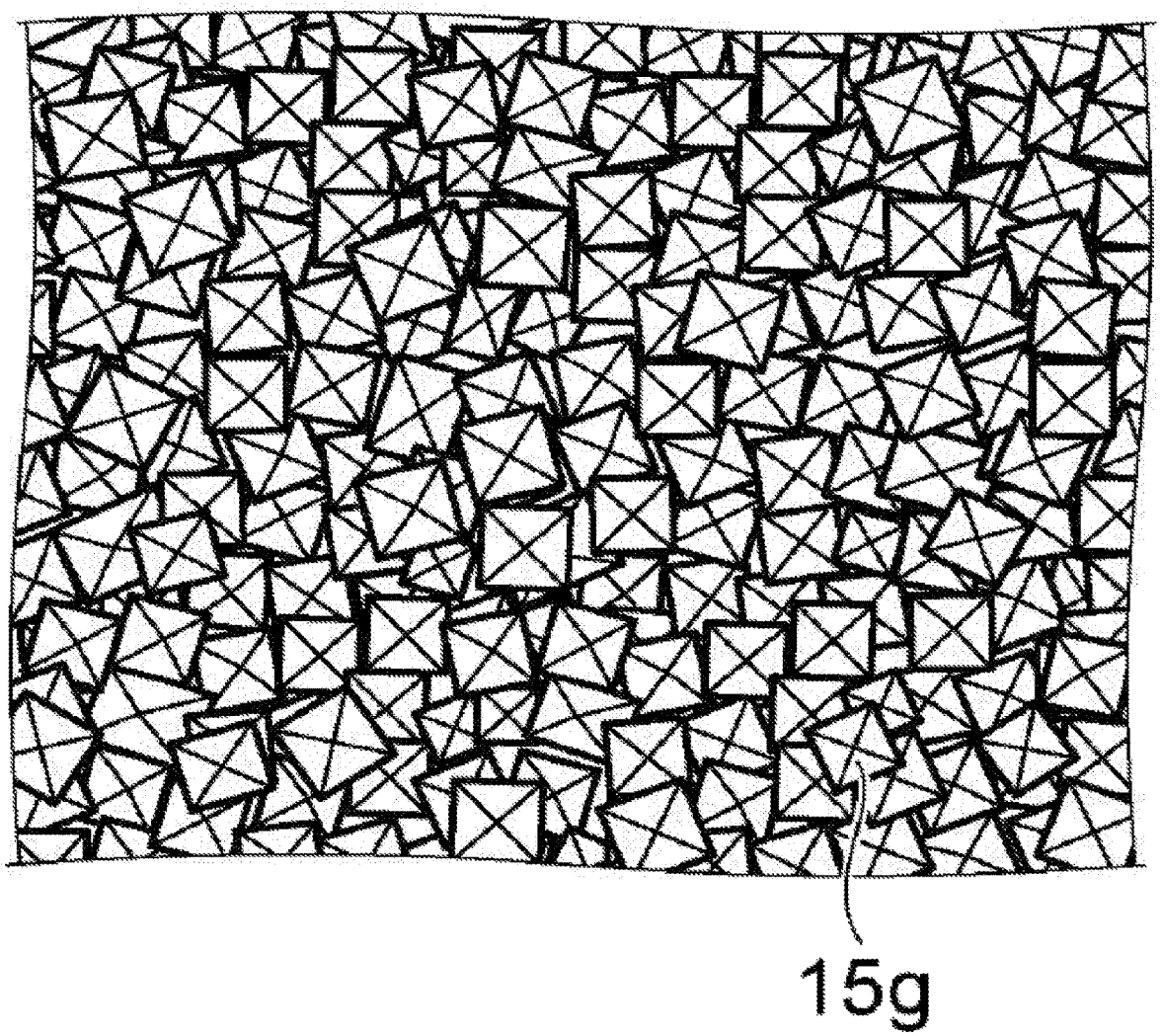
FIG. 3B is a schematic view of the switch device.

FIGS. 3A and 3B are schematic views of the switch device.

These drawings are schematic plan views based on electron micrograph images of the surface of the first layer 15 (the first surface 15f). FIG. 3A corresponds to a sample SP11. FIG. 3B corresponds to a sample SP12. In these samples, the first layer 15 is diamond. In these samples, forming conditions of the first layer 15 are different from each other. In the sample SP11, the first layer 15 is formed under a condition that a (100) plane is dominant. In the sample SP12, the first layer 15 is formed under a condition that a (111) plane is dominant. For example, a forming temperature of the sample SP11 is higher than a forming temperature of the sample SP12. For example, a carbon concentration in a source gas to form the sample SP11 is lower than a carbon concentration in a source gas to form the sample SP12.

As shown in FIG. 3A, in the sample SP11, the (100) plane of diamond is along the first surface 15f. For example, one plane (square plane) of a diamond crystal grain 15g is along the first surface 15f. In this case, a surface of a fine structure of the first surface 15f is substantially perpendicular to the Z-axis direction.

The (100) plane of diamond being along the first surface 15f indicates that, for example, in the first surface 15f of the first layer 15 facing the second electrode 20, a percentage of a rectangular crystal plane of 1 μm² or more ((100) plane) (a percentage of the number of rectangular crystal planes of 1 μm² or more that face the second electrode 20) is 80% or more. From the above viewpoint, in the first surface 15f of the first layer 15 facing the second electrode 20, a percentage of a rectangular crystal plane of 3 μm² or more is preferably 80% or more. When observing the surface of the first layer 15 with a microscope, it is possible to obtain a percentage of a rectangular crystal plane of 1 μm² or more (3 μm² or more) in the first surface 15f. For example, it is preferable to evaluate a crystal plane of the first surface 15f by observing a central 1 mm×1 mm region of the first layer 15. When the first surface 15f is a crystal plane as shown in FIG. 3A, a percentage of a rectangular crystal plane ((100) plane) of 1 μm² or more (3 μm² or more) is 100%. The crystal plane is evaluated by observing the outermost crystal in which other crystals do not overlap on the side closer to the second electrode 20.

In a case where the first layer 15 is a nitride semiconductor, a c-plane of the nitride semiconductor is preferably along the first surface 15f from a viewpoint of stabilization of a glow discharge and large current characteristics. The c-plane of the nitride semiconductor being along the first surface 15f indicates that, for example, in the first surface 15f of the first layer 15 facing the second electrode 20, a percentage of a hexagonal crystal plane of 1 μm² or more (c-plane) (a percentage of the number of hexagonal crystal planes of 1 μm² or more that face the second electrode 20) is 80% or more. From the above viewpoint, in the first surface 15f of the first layer 15 facing the second electrode 20, a percentage of a hexagonal crystal plane of 3 µm² or more is preferably 80% or more. When observing the surface of the first layer 15 with a microscope, it is possible to obtain a percentage of a hexagonal crystal plane of 1 µm² or more (3 µm² or more) in the first surface 15f. For example, it is preferable to evaluate a crystal plane of the first surface 15f by observing a central 1 mm×1 mm region of the first layer 15. The crystal plane is evaluated by observing the outermost crystal in which other crystals do not overlap on the side closer to the second electrode 20.

As shown in FIG. 3B, the tetrahedral crystal grain 15g including a (111) plane of diamond is obtained in the sample SP12. In this case, a surface of a fine structure of the first surface 15f is inclined relative to the Z-axis direction.

When the first surface 15f is a crystal plane as shown in FIG. 3A, a percentage of a rectangular crystal plane ((100) plane) of 1 µm² or more is 0%.

The first surface 15f in the sample SP11 has a fine structure with smaller surface irregularities than those on a fine structure of the first surface 15f in the sample SP12. The first surface 15f of the sample SP11 is flatter than the first surface 15f of the sample SP12.

In the sample SP11, the surface (first surface 15f) of the first layer 15 is more stable than in the sample SP12. It is possible to obtain more stable characteristics.

Since the first surface 15f of the sample SP11 includes a flat rectangular surface, the first surface 15f has few sharp portions, and electrons are emitted from the entire first surface 15f. Accordingly, a glow discharge is stabilized. However, the first surface 15f of the sample SP12 has a small rectangular top surface with a substantially quadrangular pyramid crystal. Accordingly, electrons are emitted locally in a concentrated manner, and a glow discharge easily shifts to an arc discharge. From a viewpoint of etching resistance, in the switch device 110, the sample SP11 preferably employs the first layer 15 which is unlikely to cause local concentration of electron emission.

The first surface 15f of the first layer 15 is preferably along a (100) plane. It is possible to obtain more stable characteristics.

Hereinafter described is an example of X-ray diffraction characteristics of the first layer 15 when the first layer 15 is diamond.

For example, in the X-ray diffraction of the first layer 15, or diamond, a peak having an angle 2θ of about 41.9 degrees corresponds to a crystal on a (111) plane. A peak at an angle 2θ of about 75.3 degrees corresponds to a crystal on a (220) plane. A peak at an angle 2θ of about 91.5 degrees corresponds to a crystal on a (311) plane. A peak at an angle 2θ of about 119.5 degrees corresponds to a crystal on a (400) plane.

In this embodiment, for example, a peak at about 119.5 degrees corresponding to a crystal on a (400) plane is obtained in the X-ray diffraction of the first layer 15. At a deep position in the thickness direction of the first layer 15, crystals of various orientations may exist. For this reason, the first layer 15 may also have peaks corresponding to other directions. For example, in the first layer 15 of this embodiment, for example, a first peak of first intensity is obtained when an angle 2θ of X-ray diffraction is 119° or more and 120° or less and a second peak of second intensity is obtained when the angle 2θ is 41.5° or more and 42.5° or less. The first peak is 0.2 times or more the second peak. For example, stable characteristics are easily obtained.

In this embodiment, the first layer 15 includes, for example, a plurality of crystal grains 15g (see FIG. 3A). The plurality of crystal grains 15g (length d15 shown in FIG. 3A) each preferably has a size of, for example, 0.1 µm or more and 100 µm or less. This makes it easier to obtain stable characteristics.

The first layer 15 can be formed on the base 11 by, for example, vapor phase growth using a material including the first material. The base 11 includes, for example, at least one selected from the group consisting of Mo, W, Nb, Ta, Si, and Cu. The second electrode 20 includes, for example, at least one selected from the group consisting of Ni, Cr, Mo, Cu, Ag, Au, Fe, Ir, and Pt. The first grid 31 and the second grid 32 have, for example, a mesh shape or a stripe shape. The first grid 31 and the second grid 32 can employ any configuration.

A first material with excellent thermal conductivity can be used as the base 11.

Second Embodiment

A second embodiment is a modification of the first embodiment.

Figure 4:
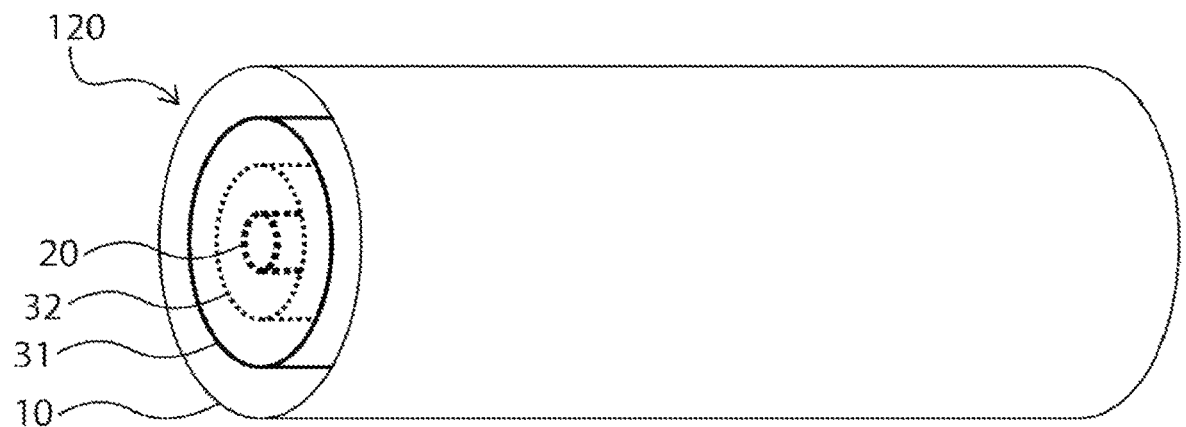
FIG. 4 is a perspective cross-sectional view schematically showing a switch device according to an embodiment.

FIG. 4 is a perspective cross-sectional view schematically showing a switch device according to this embodiment.

Figure 5:
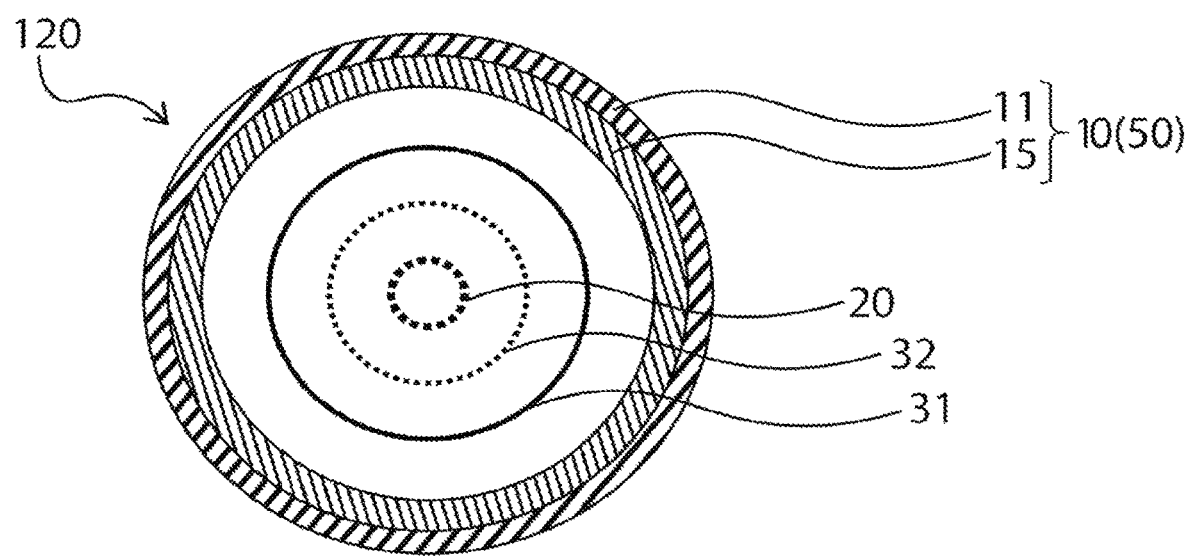
FIG. 5 is a schematic cross-sectional view of the switch device according to an embodiment.

FIG. 5 is a schematic cross-sectional view of the switch device according to this embodiment.

As shown in FIG. 4, a switch device 120 according to this embodiment includes a first electrode 10, a second electrode 20, a first grid 31, and a second grid 32. The switch device 120 of the second embodiment is basically equivalent to the switch device 110 of the first embodiment except that the first electrode 10, the second electrode 20, the first grid 31, and the second grid 32 are arranged coaxially. Items common between the switch device 110 of the first embodiment and the switch device 120 of the second embodiment will not be described.

In the switch device 120, the second grid 32, the first grid 31, and the first electrode 10 are arranged in that order from the inside, centering on the second electrode 20. The first electrode 10 is a container 50 of the switch device 120.

Although a first terminal T1, a second terminal T2, a third terminal T3, and a fourth terminal T4 are not shown, for example, the first terminal T1 is electrically connected to the first electrode 10, the second terminal T2 is electrically connected to the second electrode 20, the third terminal T3 is electrically connected to the first grid 31, and the fourth terminal T4 is electrically connected to the second grid 32.

The first electrode 10 is the container 50 that houses the second electrode 20, the first grid 31, and the second grid 32. The first electrode 10 has an inner wall provided with a first layer 15. Since a first material included in the first layer 15 is excellent in thermal conductivity, the first electrode 10 employs both an aspect where the first electrode 10 includes the first layer 15 and an aspect where the first electrode 10 has the inner wall provided with the first layer 15 and an outer wall provided with a base 11.

The base 11 of the second embodiment preferably has both pressure resistance and thermal conductivity as the container 50. The base 11 having both pressure resistance and thermal conductivity and included in the outer wall of the first electrode 10 includes at least one selected from the group consisting of sintered diamond, polycrystalline diamond, graphite, nitride semiconductor, and alumina cement. In regard to the base 11 included in the outer wall of the first electrode 10 and having both pressure resistance and thermal conductivity, the base 11 has a structure with a single layer including at least one selected from the group consisting of sintered diamond, polycrystalline diamond, graphite, nitride semiconductor, and alumina cement or includes a laminate with two or more layers including at least one selected from the group consisting of sintered diamond, polycrystalline diamond, graphite, nitride semiconductor, and alumina cement.

Arranging the second grid 32, the first grid 31, and the first electrode 10 to draw concentric circles around the second electrode 20 makes good symmetry, which enables excellent large current characteristics and stabilizes a glow discharge.

A coaxial structure prevents unintended discharges thanks to a uniform electric field and enhances the reliability of the switch device 120.

A coaxial structure makes the entire inner wall of the container 50 into a cathode and increases an area proportion of the first electrode 10 serving as a cathode, which is suitable for switching more currents.

A coaxial structure increases an electric field toward the second electrode 20 serving as an anode, which promotes an avalanche of electrons and increases current amplification effects.

A coaxial structure relatively weakens an electric field near a cathode and reduces the kinetic energy of cations that collide with the cathode, which suppresses damage to the cathode and achieves life-span extension of the cathode.

As an example of a method for manufacturing the first electrode 10, a filament is attached to the inside of the cylindrical base 11, a carbon source is supplied, and a diamond film as the first layer 15 is formed inside the base 11 by thermal CVD.

According to this embodiment, it is possible to provide a switch device that enables switching of large currents.

Embodiments of this disclosure have been described with reference to specific examples. However, this disclosure is not limited to these specific examples. For example, in regard to specific configurations of elements such as an electrode, a first layer, a grid, and a container included in a switch device, any specific configuration is included in the scope of this disclosure as long as a person skilled in the art appropriately selects a configuration from a known range and appropriately implements this disclosure to obtain similar effects.

In addition, any two or more elements of the specific examples combined within a technically possible range are also included in the scope of this disclosure as long as the combination includes the gist of this disclosure.

Furthermore, based on the switch device described above as an embodiment of this disclosure, all switch devices that can be appropriately designed and implemented by a person skilled in the art also belong to the scope of this disclosure as long as those devices include the gist of this disclosure.

Still further, a person skilled in the art can come up with various modifications and amendments within the concept of this disclosure, and it should be noted that those modifications and amendments also belong to the scope of this disclosure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A switch device comprising:
    a first electrode including a first layer including at least one selected from the group consisting of B, C, Al, Si, and Ga;
    a second electrode separated from the first electrode;
    a first grid disposed between the first electrode and the second electrode; and
    a second grid disposed between the first grid and the second electrode.

2. The switch device according to claim 1, further comprising a gas disposed between the first electrode and the second electrode, the gas including at least one selected from the group of argon, helium, and hydrogen.

3. The switch device according to claim 1, wherein the first layer includes at least one selected from the group consisting of diamond, graphite, nitride semiconductor, and alumina cement.

4. The switch device according to claim 3, wherein the first layer includes a plurality of crystal grains.

5. The switch device according to claim 4, wherein the plurality of crystal grains each has a size of 0.1 μm or more and 100 μm or less.

6. The switch device according to claim 3, wherein the first layer includes a first surface facing the second electrode, the first surface including hydrogen.

7. The switch device according to claim 3,
    wherein the first layer includes a first surface facing the second electrode,
    the first surface includes diamond, and
    the diamond on the first surface is along a (100) plane.

8. The switch device according to claim 7,
    wherein, in the first layer, a first peak of first intensity is obtained when an angle 2θ of X-ray diffraction is 119° or more and 120° or less and a second peak of second intensity is obtained when the angle 2θ is 41.5° or more and 42.5° or less, and
    the first peak is 0.2 times or more the second peak.

9. The switch device according to claim 1,
    wherein the first layer includes a first surface facing the second electrode,
    the first surface includes $Al_xGa_yN_{1-x-y}$ where x of $Al_xGa_yN_{1-x-y}$ satisfies $0 \leq x \leq 1$ and y of $Al_xGa_yN_{1-x-y}$ satisfies $0 \leq y \leq 1$, and
    $Al_xGa_yN_{1-x-y}$ on the first surface is along a c-plane.

10. The switch device according to claim 1, wherein the first layer has an electron affinity of 3 eV or less.

11. The switch device according to claim 1, wherein the first layer has a band gap of 2 eV or more.

12. The switch device according to claim 1, wherein the first layer has a thickness of 0.1 μm or more and 5 mm or less.

13. The switch device according to claim 1, comprising:
    a first terminal electrically connected to the first electrode;
    a second terminal electrically connected to the second electrode;
    a third terminal electrically connected to the first grid; and
    a fourth terminal electrically connected to the second grid,
    wherein a current flowing between the first terminal and the second terminal in a second state is larger than a current flowing between the first terminal and the second terminal in a first state,
    in the first state, the first terminal is set to a first potential, the second terminal is set to a second potential higher than the first potential, the third terminal is set to a third potential between the first potential and the second potential, and the fourth terminal is set to a fourth potential lower than the third potential, and in the second state, the first terminal is set to the first potential, the second terminal is set to the second potential, the third terminal is set to the third potential, and the fourth terminal is set to a fifth potential higher than the third potential.

14. The switch device according to claim 13, wherein, in the first state, a first plasma is generated in a first space between the first electrode and the first grid.

15. The switch device according to claim 13, wherein, in the second state, a second plasma is generated in a second space between the first grid and the second grid.

16. The switch device according to claim 15, wherein, in the second state, a third plasma is generated in a third space between the second grid and the second electrode.

17. The switch device according to claim 1, further comprising a container,
wherein the first electrode, the second electrode, the first grid, and the second grid are disposed inside the container.

18. The switch device according to claim 17, wherein the container is a closed container, and
the first terminal, the second terminal, the third terminal, and the fourth terminal are disposed outside the container.

19. The switch device according to claim 1,
wherein the first electrode is a container configured to house the second electrode, the first grid, and the second grid,
the first electrode, the first grid, and the second grid are arranged coaxially about the second electrode, and
the first electrode has an inner wall facing the second electrode, the inner wall being provided with the first layer.

20. The switch device according to claim 19, wherein the first electrode has an outer wall opposite to the first layer, the outer wall including at least one selected from the group consisting of sintered diamond, polycrystalline diamond, graphite, nitride semiconductor, and alumina cement.

\* \* \* \* \*